(12) United States Patent
Lee

(10) Patent No.: US 10,737,366 B2
(45) Date of Patent: Aug. 11, 2020

(54) DRESSING APPARATUS AND WAFER POLISHING APPARATUS COMPRISING SAME

(71) Applicant: SK SILTRON CO., LTD., Gumi-si, Gyeongsangbuk-do (KR)

(72) Inventor: Seung Won Lee, Gumi-si (KR)

(73) Assignee: SK SILTRON CO., LTD., Gyeongsangbuk-Do (KR)

( * ) Notice: Subject to any disclaimer, the term of this patent is extended or adjusted under 35 U.S.C. 154(b) by 280 days.

(21) Appl. No.: 15/758,163

(22) PCT Filed: Jan. 28, 2016

(86) PCT No.: PCT/KR2016/000933
§ 371 (c)(1),
(2) Date: Mar. 7, 2018

(87) PCT Pub. No.: WO2017/073845
PCT Pub. Date: May 4, 2017

(65) Prior Publication Data
US 2018/0243882 A1 Aug. 30, 2018

(30) Foreign Application Priority Data
Oct. 29, 2015 (KR) .................... 10-2015-0150851

(51) Int. Cl.
*B24B 53/017* (2012.01)
*B24B 55/06* (2006.01)
*H01L 21/67* (2006.01)

(52) U.S. Cl.
CPC ............ *B24B 53/017* (2013.01); *B24B 55/06* (2013.01); *H01L 21/67046* (2013.01); *H01L 21/67051* (2013.01)

(58) Field of Classification Search
CPC . B24B 53/017; B24B 55/06; H01L 21/67046; H01L 21/67051
See application file for complete search history.

(56) References Cited

U.S. PATENT DOCUMENTS

2001/0029155 A1* 10/2001 Bennett ................. B24B 37/042
451/56
2003/0190874 A1* 10/2003 So ........................ B24B 29/005
451/56

(Continued)

FOREIGN PATENT DOCUMENTS

JP 2000-042899 2/2000
JP 2001-237204 8/2001

(Continued)

OTHER PUBLICATIONS

Japanese Office Action dated Jan. 18, 2019 issued in Application No. 2018-512290.

(Continued)

*Primary Examiner* — Dung Van Nguyen
(74) *Attorney, Agent, or Firm* — KED & Associates, LLP

(57) ABSTRACT

An embodiment according to the present invention relates to a dressing apparatus for cleaning a polishing pad attached to a lower surface plate, the dressing apparatus comprising: a brushing part comprising a brush; a cleaning solution spray unit, comprising a spray nozzle, for spraying the polishing pad with cleaning solution; and a suction unit, comprising a suction inlet, for suctioning particles generated when the cleaning solution is sprayed by the cleaning solution spray unit, wherein the brushing unit, cleaning solution spray unit and suction unit are attached to each other and swing above the polishing pad in unison.

18 Claims, 17 Drawing Sheets

(56) References Cited

U.S. PATENT DOCUMENTS

| | | | |
|---|---|---|---|
| 2006/0121837 A1* | 6/2006 | Seike | B24B 53/017 |
| | | | 451/56 |
| 2007/0087672 A1 | 4/2007 | Benner | |
| 2008/0102737 A1 | 5/2008 | Chang et al. | |

FOREIGN PATENT DOCUMENTS

| | | |
|---|---|---|
| JP | 2001-277095 | 10/2001 |
| JP | 2007-035973 | 2/2007 |
| JP | 2008-194767 | 8/2008 |
| JP | 2009-512569 | 3/2009 |
| KR | 10-2004-0070588 | 8/2004 |
| KR | 10-2011-0016706 | 2/2011 |
| KR | 10-2014-0019727 | 2/2014 |

OTHER PUBLICATIONS

International Search Report (with English Translation) and Written Opinion dated Jul. 28, 2016 issued in Application No. PCT/KR2016/000933.

Korean Office Action dated Mar. 9, 2017 issued in Application No. 10-2015-0150851.

Korean Office Action dated Sep. 29, 2017 issued in Application No. 10-2015-0150851.

\* cited by examiner

| DIAMETER | UNPOLISHED | DURING POLISHING | DURING DRESSING |
|---|---|---|---|
| 0.1(um) | 59 | 99454 | 2167734 |
| 0.2(um) | 12 | 33758 | 124706 |
| 0.3(um) | 11 | 16263 | 91023 |
| 0.5(um) | 2 | 3461 | 29679 |
| 1.0(um) | 1 | 1219 | 11627 |
| 5.0(um) | 0 | 17 | 19 |

DRESSING APPARATUS AND WAFER POLISHING APPARATUS COMPRISING SAME

CROSS-REFERENCE TO RELATED PATENT APPLICATIONS

This application is a U.S. National Stage Application under 35 U.S.C. § 371 of PCT Application No. PCT/KR2016/000933, filed Jan. 28, 2016, which claims priority to Korean Patent Application No. 10-2015-0150851, filed Oct. 29, 2015, whose entire disclosures are hereby incorporated by reference.

TECHNICAL FIELD

Embodiments relate to a dressing apparatus for dressing a polishing pad and to a wafer polishing apparatus including the same.

BACKGROUND ART

In order to realize global planarization of a semiconductor device having a multilayer wiring structure, a chemical mechanical polishing (CMP) process may be applied to a wafer. The CMP process is a process in which mechanical processing using an abrasive, which is present between a pressurized wafer and a polishing pad, and chemical etching using a compound such as slurry or the like are carried out at the same time.

When the CMP process is performed, substances removed from the surface of the water and slurry may accumulate on the surface of the polishing pad. In order to remove particles accumulated on the surface of the polishing pad and to maintain consistent polishing performance of the polishing pad, a dressing process is applied to the polishing pad via a polishing pad dressing apparatus.

While a dressing process using a dressing apparatus is performed after a CMP process, e.g. a final polishing process, fine particles may be adsorbed onto the surface of the wafer. Such fine particles adsorbed onto the surface of the wafer may cause local unevenness over the surface of the wafer.

DISCLOSURE

Technical Problem

Embodiments provide a dressing apparatus, which is capable of improving polishing uniformity and of suppressing defects, and a wafer polishing apparatus including the same.

Technical Solution

An embodiment relates to a dressing apparatus for dressing a polishing pad attached to a lower plate, and the dressing apparatus includes a brushing unit including a brush; a cleaning liquid spray unit including a spray nozzle for spraying cleaning liquid to the polishing pad; and a suction unit including a suction port for sucking particles that are generated when the cleaning liquid spray unit sprays cleaning liquid, wherein the brushing unit, the cleaning liquid spray unit and the suction unit are coupled to each other and swing together on the polishing pad.

The brushing unit, the cleaning liquid spray unit and the suction unit swing on the polishing pad at the same swing speed in the state of being coupled to each other.

The spray nozzle may be disposed spaced apart from the brushing unit in the horizontal direction, the suction port may be disposed spaced apart from the spray nozzle in the horizontal direction, and the horizontal direction may be a direction that is parallel to the top surface of the polishing pad.

The dressing apparatus may further include a first fixing portion for fixing the cleaning liquid spray unit to the brushing unit; and a second fixing portion for fixing the suction unit to the cleaning liquid spray unit.

Each of the cleaning liquid spray unit and the suction port may be spaced apart from the brushing unit and the suction port may be disposed so as to surround the outer surface of the spray nozzle.

The dressing apparatus may further include a blocking unit protruding in the downward direction further than the lower end of the suction port so as to surround the suction port.

The cleaning liquid spray unit, the suction unit and the brushing unit may be in contact with each other in sequence.

The brushing unit, the suction unit and the cleaning liquid spray unit may be arranged in sequence in the inward direction from the outside. The suction port of the suction unit may surround the outer surface of the cleaning liquid spray unit and the brushing unit may surround the outer surface of the spray nozzle of the cleaning liquid spray unit. The dressing apparatus may further include a blocking unit disposed so as to be in contact with the outer surface of the brushing unit and protruding in the downward direction further than the bottom surface of the brushing unit.

Alternatively, the suction unit, the cleaning liquid spray unit and the brushing unit may be arranged in sequence in the inward direction from the outside. The spray nozzle of the cleaning liquid spray unit may surround the outer surface of the brushing unit and the suction port of the suction unit may surround the outer surface of the spray nozzle of the cleaning liquid spray unit. The dressing apparatus may further include a blocking unit disposed so as to be in contact with the outer surface of the suction port of the suction unit and protruding in the downward direction further than the bottom surface of the suction port of the suction unit.

Alternatively, the brushing unit, the cleaning liquid spray unit and the suction unit may be arranged in sequence in the inward direction from the outside. The spray nozzle of the cleaning liquid spray unit may surround the outer surface of the suction port of the suction unit and the brushing unit may surround the outer surface of the spray nozzle of the cleaning liquid spray unit.

The suction unit may further include a discharge pipe for discharging particles, sucked through the suction port, at a predetermined pressure or at a predetermined flow rate, and the suction port may have a diameter larger than the diameter of the discharge pipe.

The distance by which the suction port is spaced apart from the spray nozzle may be shorter than the distance by which the spray nozzle is spaced apart from the brushing unit.

A dressing apparatus for dressing a polishing pad attached to a lower plate according to another embodiment includes a brushing unit for brushing the polishing pad; a cleaning liquid spray unit for spraying cleaning liquid to the polishing pad; and a suction unit for sucking particles that are generated when the cleaning liquid spray unit sprays cleaning liquid, wherein the brushing unit, the cleaning liquid spray unit and the suction unit are fixed to each other and swing on the polishing pad at the same swing speed.

The brushing unit may further include a brush for brushing the polishing pad; and a brush-moving portion for swinging the brush on the surface of the polishing pad, and the brush-moving portion may swing the brush, the cleaning liquid spray unit and the suction unit on the polishing pad at the same swing speed.

A wafer polishing apparatus according to an embodiment includes a polishing table including a lower plate and a polishing pad attached to the lower plate; a head unit for loading a wafer onto the polishing pad and polishing the loaded wafer by pressurizing the wafer; and a dressing apparatus for dressing the polishing pad according to the embodiment.

Advantageous Effects

Embodiments are capable of improving polishing uniformity and of suppressing defects.

BEST MODE

Figure 1:
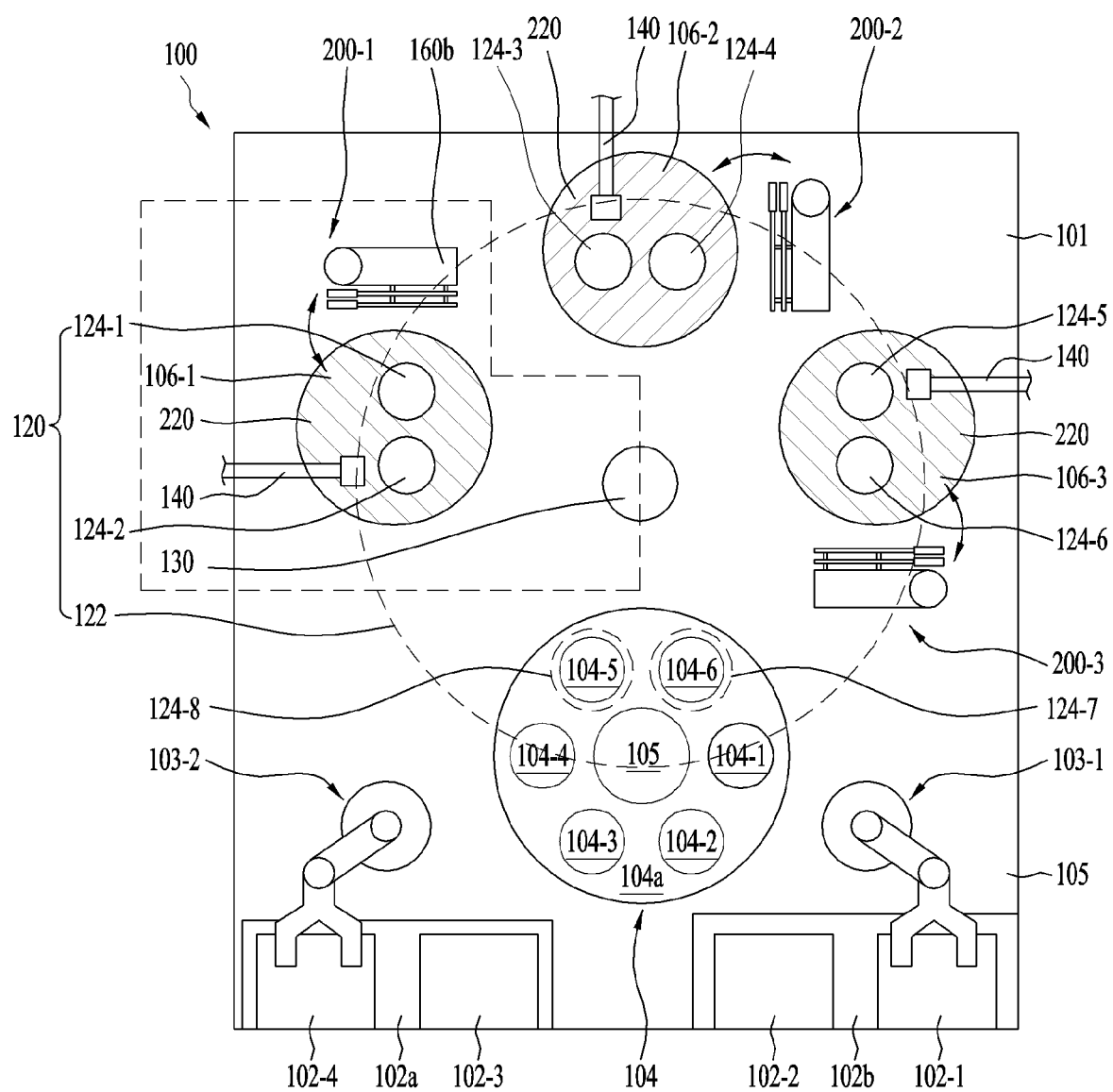
FIG. 1 illustrates a perspective view of a wafer polishing apparatus according to an embodiment.

Hereinafter, embodiments will be clearly understood from the attached drawings and the description associated with the embodiments. In the description of the embodiments, it will be understood that when an element, such as a layer (film), a region, a pattern or a structure, is referred to as being "on" or "under" another element, such as a substrate, a layer (film), a region, a pad or a pattern, the term "on" or "under" means that the element is "directly" on or under another element or is "indirectly" formed such that an intervening element may also be present. In addition, it will also be understood that the criteria of "on" or "under" is on the basis of the drawings.

In the drawings, elements may be exaggerated in size, omitted or schematically illustrated for convenience in description and clarity. Further, the sizes of elements do not indicate the actual sizes of the elements. Wherever possible, the same reference numbers will be used throughout the drawings to refer to the same parts.

Figure 2:
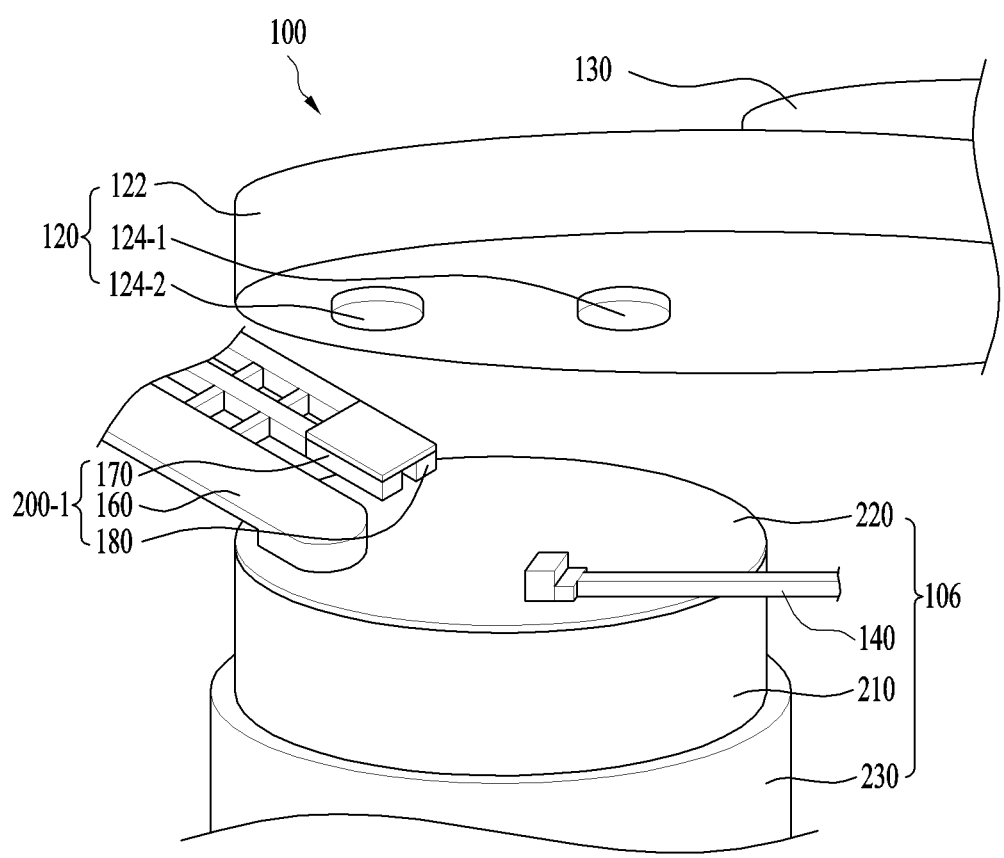
FIG. 2 illustrates a first dressing apparatus depicted in FIG. 1.

FIG. 1 illustrates a perspective view of a wafer polishing apparatus 100 according to an embodiment, and FIG. 2 illustrates a first dressing apparatus 200-1 depicted in FIG. 1.

Referring to FIGS. 1 and 2, the wafer polishing apparatus 100 includes a body 101, wafer storage units 102-1 to 102-4, feeding robots 103-1 and 103-2, a transfer unit 104, polishing tables 106-1 to 106-3, a head unit 120, a moving unit 130, a slurry supply unit 140, and dressing units 200-1 to 200-3.

The body 101 provides a stage on which a wafer polishing process and a dressing process are performed.

The wafer storage units 102-1 to 102-4 are spaces for storing wafers therein. For example, the wafer storage units 102-1 to 102-4 may be spaces in which cassettes, on which wafers can be loaded, are arranged or loaded.

The wafer storage units 102-1 to 102-4 may include a loading portion 102a, on which wafers to be polished are loaded, and an unloading portion 102b, from which wafers that have been completely polished are unloaded.

The feeding robots 103-1 and 103-2 feed wafers to be polished, which are loaded on the loading portion 102a, to the transfer unit 104, or feed wafers, which have been completely polished and are loaded on the transfer unit 104, to the unloading portion 102b.

The transfer unit 104 transfers the wafers, which are fed by the feeding robot 103-2, to the head unit 120, or transfers the polished wafers, which are fed by the head unit 120, to the feeding robot 103-1.

The transfer unit 104 may include a table 104a, a rotary shaft 105 configured to rotate the table 104a, and wafer supports 104-1 to 104-6, which are disposed on the table 104a and are configured to be rotated together with the table 104a.

The wafers, which are fed by the feeding robot 103-2, or the polished wafers, which are fed by the head unit 120, may be seated on the wafer supports 104-1 to 104-6.

The table 104a may be configured to be rotated at a predetermined angle about the rotary shaft 105. The wafer supports 104-1 to 104-6 may be arranged on the table 104*a* so as to be spaced apart from each other, and may be rotated together with the table 104*a*.

The wafers to be polished, which are seated on the wafer supports (for example, 104-3 and 104-4), may be transferred to the head unit 120 by the rotation of the table 104*a*. Further, the polished wafers, which are seated on the wafer supports (for example, 104-5 and 104-6), may be transferred to a place, to which the feeding robot 103-1 has access, by the rotation of the table 104*a*.

The polishing tables 106-1 to 106-3 may be arranged on the top surface of the body 101 so as to be spaced apart from each other.

Each of the polishing tables 106-1 to 106-3 may include a lower plate, a polishing pad disposed on the top surface of the lower plate, and a rotary unit for rotating the lower plate. Although it is illustrated in FIG. 1 that three polishing tables are provided to sequentially perform the polishing processes three times, the number of polishing tables is not limited thereto, and may be two or more depending on the number of polishing processes.

Referring to FIG. 2, the first polishing table 106-1 may include a lower plate 210, a polishing pad 220 disposed on the top surface of the lower plate 210, and a rotary unit 230 for rotating the lower plate 210 in a first direction, for example, in a clockwise direction or in a counterclockwise direction. The first to third polishing tables 106-1 to 106-3 may have the same configuration as each other.

The head unit 120 adsorbs at least one wafer to be polished, which is seated on the wafer supports (for example, 104-5 and 104-6) of the transfer unit 104, loads the at least one adsorbed wafer to be polished onto the polishing tables 106-1 to 106-3, and pressurizes the loaded wafer, thereby performing the polishing process with respect to the wafer.

For example, the head unit 120 may adsorb one surface (for example, the top surface or the bottom surface) of at least one wafer loaded on the transfer unit 104, and may load the at least one adsorbed wafer onto the first polishing table 160-1. In addition, the head unit 120 may pressurize the at least one wafer to be polished, which is loaded on the first polishing table 106-1, and the opposite surface (for example, the bottom surface or the top surface) of the at least one wafer may be polished by the polishing pads 220 of the polishing tables 106-1 to 106-3.

The head unit 120 may perform polishing processes while carrying the at least one adsorbed wafer to the first to third polishing tables 106-1 to 106-3 in that order. Although it is illustrated in FIG. 1 that each wafer undergoes polishing processes three times, the present invention is not limited thereto.

The head unit 120 may include an upper plate 122, a plurality of head chucks 124-1 to 124-8 disposed on the bottom surface of the upper plate 122, and a rotary unit 130 for rotating the upper plate 122.

The head chucks (for example, 124-1 to 124-6) may be disposed or arranged so as to correspond to the polishing tables 106-1 to 106-3. Although it is illustrated in FIG. 1 that two head chucks are arranged so as to be spaced apart from each other on a portion of the bottom surface of the upper plate that corresponds to a respective one of the polishing tables 106-1 to 106-3, the present invention is not limited thereto.

The upper plate 122 may be rotated about the rotary unit 130 at a predetermined angle so that the head chucks 124-1 to 124-6 are aligned with the polishing tables 106-1 to 106-3, and may be kept stationary without being rotated during the polishing process. At this time, the head chucks 124-7 and 124-8 may be aligned with the wafer supports 104-5 and 104-6 of the transfer unit 104 in order to prepare for the subsequent polishing process.

The head chucks 124-1 to 124-8 may be movable vertically, may adsorb wafers, may pressurize the wafers, and may rotate the adsorbed wafers in a predetermined direction during the polishing process.

In the polishing process, the direction in which the head chucks 124-1 to 124-6 are rotated may be the same as the direction in which the polishing tables 106-1 to 106-3 are rotated. However, the present invention is not limited thereto.

When the polishing process is completed, the head chucks 124-1 to 124-6 may be raised, with the wafers adsorbed thereto. When the head chucks 124-1 to 124-6 have been completely raised, the upper plate 122 may be rotated in a predetermined direction, for example, in a clockwise direction, so as to carry the polished wafers to the subsequent polishing table.

The slurry supply unit 140 supplies slurry to the polishing pads 220 of the polishing tables 106-1 to 106-3 while the wafers are polished.

Each of the dressing apparatuses 200-1 to 200-3 dresses the polishing pad 220 of a corresponding one of the polishing tables 106-1 to 106-3.

For example, each of the dressing apparatuses 200-1 to 200-3 may dress the polishing pad 220 of a corresponding one of the polishing tables 106-1 to 106-3 after the wafers, which have been completely polished in the polishing tables 106-1 to 106-3, are separated from the polishing pads 220 by the head chucks 124-1 to 124-6.

The dressing apparatuses 200-1 to 200-3 may have the same configuration as each other. Each of the dressing apparatuses 200-1 to 200-3 includes a brushing unit for brushing the polishing pad 220, a cleaning liquid spray unit for spraying cleaning liquid to the polishing pad, and a suction unit for sucking air particles that are generated during the brushing and the spraying of the cleaning liquid.

Figure 3:
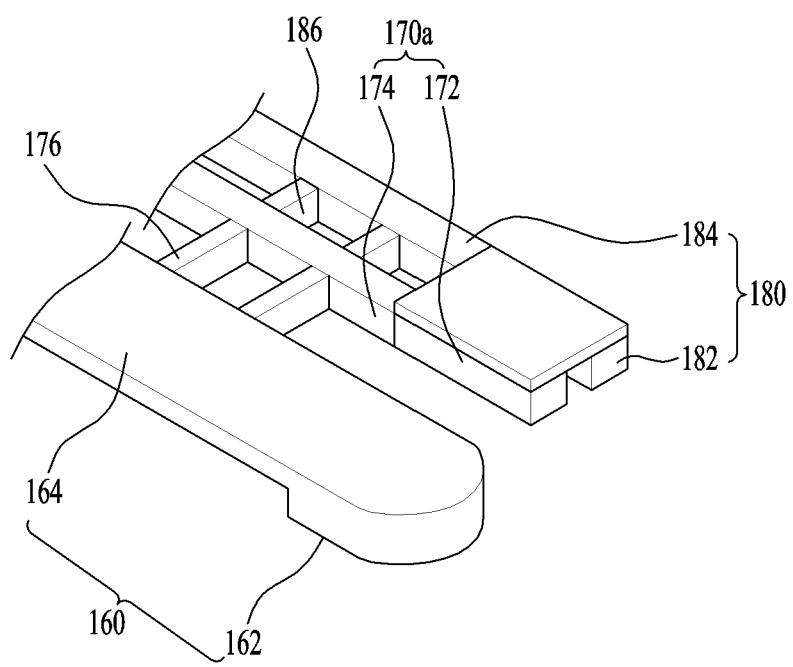
FIG. 3 is a perspective view illustrating one embodiment of the first dressing apparatus depicted in FIG. 1.
Figure 4:
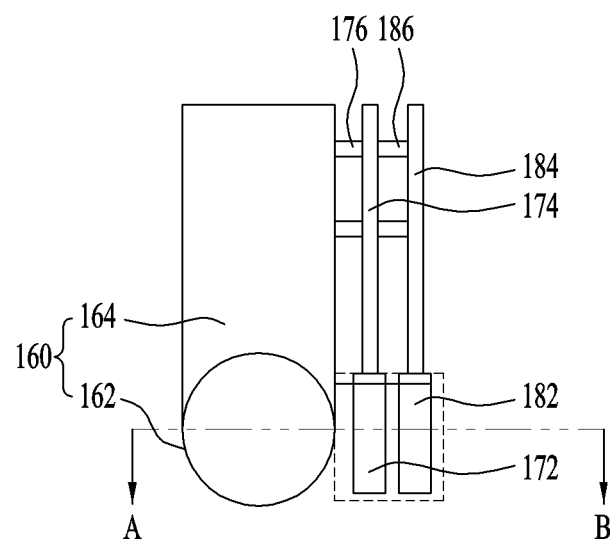
FIG. 4 illustrates a plan view of the first dressing apparatus depicted in FIG. 3.
Figure 5:
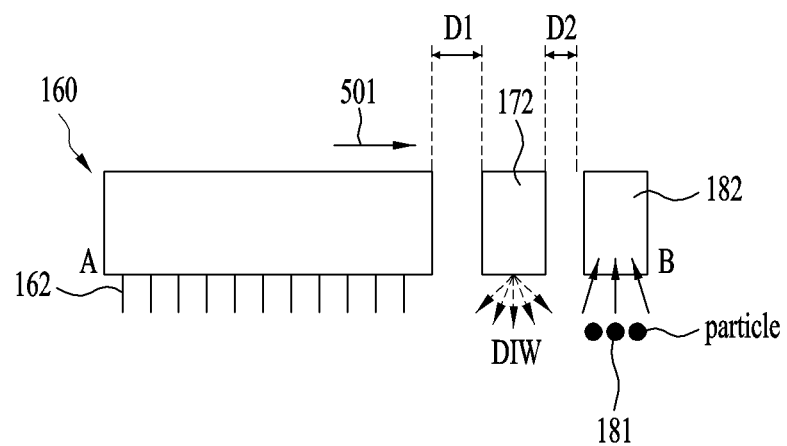
FIG. 5 illustrates a cross-sectional view of the first dressing apparatus depicted in FIG. 4 when viewed in the AB direction.

FIG. 3 is a perspective view illustrating one embodiment of the first dressing apparatus 200-1 depicted in FIG. 1, FIG. 4 illustrates a plan view of the first dressing apparatus 200-1 depicted in FIG. 3, and FIG. 5 illustrates a cross-sectional view of the first dressing apparatus 200-1 depicted in FIG. 4 when viewed in the AB direction.

Referring to FIGS. 3 to 5, the first dressing apparatus 200-1 may include a brushing unit 160, a cleaning liquid spray unit 170, and a suction unit 180.

The brushing unit 160, the cleaning liquid spray unit 170 and the suction unit 180 may be coupled or fixed to each other.

The brushing unit 160 may include a brush 162, which is disposed at one end 160*a* thereof, and a brush-moving portion 164 for moving the brush 162 onto the polishing pad 220.

For example, the brush 162 may be located at the one end 160*a* of the bottom surface of the brush-moving portion 164. The brush-moving portion 164 may rotate or swing about the opposite end thereof to the left or to the right at a predetermined angular speed so as to move the brush 162 onto the top surface of the polishing pad 220.

In the dressing process, the surface of the polishing pad 220 may be brushed by the brush, which has been moved onto the top surface of the polishing pad 220 by the brush-moving portion 162. Accordingly, foreign substances or glazing, which remains on the surface of the polishing pad 220 after the polishing process, may be removed. "Glazing"

refers to solid substances, which are formed by vitrification and adhesion of reactants of a wafer, slurry particles, foreign substances, and the like under conditions of high pressure and high temperature. Such glazing formed in this way may cause deformation of the thickness profile of the pad and deterioration in the flatness of the wafer, and consequently, may shorten the lifespan of the pad.

The cleaning liquid spray unit 170 is disposed adjacent to the brushing unit 160, and sprays cleaning liquid, for example, deionized water (DIW), to the polishing pad 220 during the dressing process.

The cleaning liquid spray unit 170 may spray high-pressure cleaning liquid. For example, the cleaning liquid spray unit 170 may be implemented by a High Pressure Micro Jet (HPMJ), and may spray fine-mist-type cleaning liquid.

The cleaning liquid spray unit 170 may include a spray nozzle 172 having therein a hole, through which the cleaning liquid is sprayed, and a cleaning liquid supply pipe 174, through which the cleaning liquid is supplied to the spray nozzle 172 at a high pressure.

The cleaning liquid spray unit 170 may be disposed at one side of the brushing unit 160, and may be moved onto the surface of the polishing pad 220 together with the brushing unit 160.

For example, the one side of the brushing unit 160, at which the cleaning liquid spray unit 170 is disposed, may be located closer to the polishing pad 220 than the opposite side of the brushing unit 160. That is, the cleaning liquid spray unit 170 may be located between the one side of the brushing unit 160 and the polishing pad 220.

The cleaning liquid spray unit 170 may be fixed to the brushing unit 160 by a first fixing portion 176. For example, the first fixing portion 176 may interconnect the cleaning liquid supply pipe 174 and the brush-moving portion 162.

The suction unit 180 is disposed at one side of the cleaning liquid spray unit 170, and sucks particles that are generated by the cleaning liquid sprayed at a high pressure from the cleaning liquid spray unit 170.

The suction unit 180 may be fixed to the cleaning liquid spray unit 170 by a second fixing portion 186. For example, the second fixing portion 186 may interconnect the cleaning liquid supply pipe 174 and a discharge pipe 184.

The brushing unit 160, the cleaning liquid spray unit 170 and the suction unit 180 may swing at the same angular speed or at the same swing speed on the polishing pad 220 in the state of being fixed or coupled to each other.

Since the cleaning liquid spray unit 170 and the suction unit 180 are fixed to the brushing unit 160 by the first and second fixing portions 176 and 186, the cleaning liquid spray unit 170 and the suction unit 180 are capable of being moved together with the brushing unit 160. For example, the cleaning liquid spray unit 170 and the suction unit 180 may be rotated at the same angular speed or at the same swing speed as the brushing unit 160.

In addition, the spraying of cleaning liquid from the spray nozzle 172 of the cleaning liquid spray unit 170 and the suction of particles 181 into a suction port 182 of the suction unit 180 may be performed at the same time.

The suction unit 180 may be formed of a metal material or of a plastic material, which does not cause a polluting source, for example, PC, PVC, polypropylene, Teflon, or the like.

Figure 6:
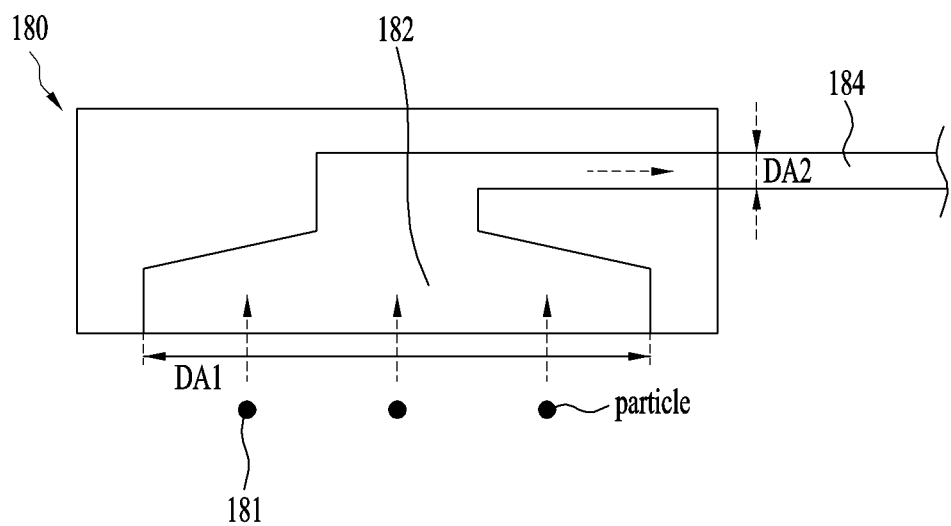
FIG. 6 illustrates a cross-sectional view of a suction unit depicted in FIG. 4.

FIG. 6 illustrates a cross-sectional view of the suction unit 180 depicted in FIG. 4.

Referring to FIG. 6, the suction unit 180 may include a suction port 182 for sucking particles 181 and a discharge pipe 184 connected to the suction port 182 in order to discharge the particles 181, which have been sucked through the suction port 182, at a predetermined pressure (or suction force) or at a predetermined flow rate. The discharge pipe 184 may be of a tube type. However, the present invention is not limited thereto. In order to enhance the suction force, the diameter DA1 of the suction port 182 may be larger than the diameter DA2 of the discharge pipe 184 (DA1>DA2).

Referring to FIG. 5, the spray nozzle 172 of the cleaning liquid spray unit 170 may be located spaced apart from the brushing unit 160 by a first distance D1 in the horizontal direction 501, and the suction port 182 of the suction unit 180 may be located spaced apart from the spray nozzle 172 by a second distance D2 in the horizontal direction 501. For example, the horizontal direction 501 may be a direction that is parallel to the top surface of the polishing pad 220. For example, the horizontal direction 501 may be a direction that is perpendicular to the longitudinal direction of the brushing unit 160, the longitudinal direction of the cleaning liquid spray unit 170, or the longitudinal direction of the suction unit 180.

In order to increase the rate of suction of the particles, which are generated by the cleaning liquid sprayed from the spray nozzle 172, the second distance D2 may be shorter than the first distance D1 (D2<D1). However, the present invention is not limited thereto. In another embodiment, the condition may be as follows: D1=D2 or D1<D2.

Figure 7A:
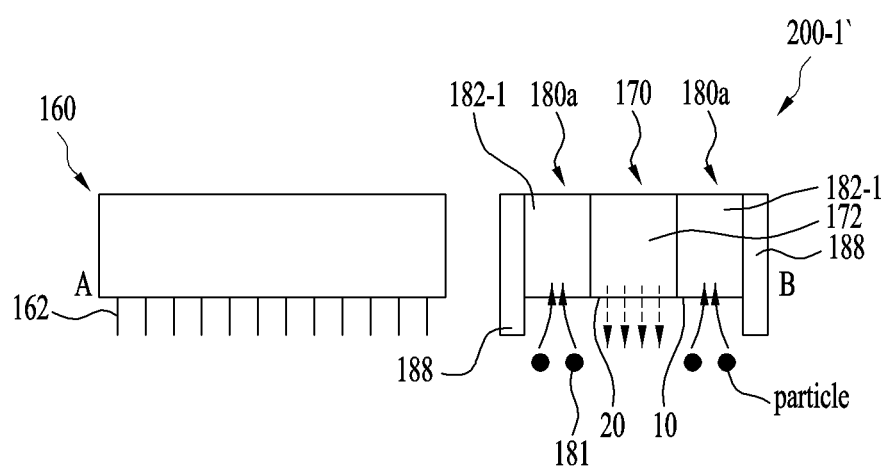
FIG. 7A illustrates a cross-sectional view of a first dressing apparatus according to another embodiment when viewed in the AB direction.
Figure 7B:
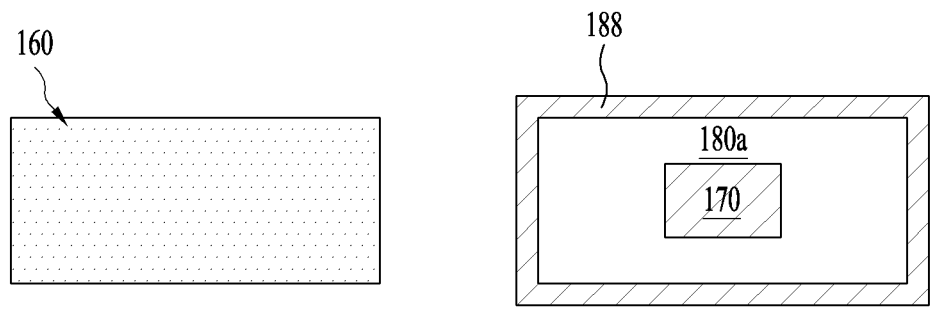
FIG. 7B illustrates a bottom view of the first dressing apparatus depicted in FIG. 7A.

FIG. 7A illustrates a cross-sectional view of a first dressing apparatus 200-1' according to another embodiment when viewed in the AB direction, and FIG. 7B illustrates a bottom view of the first dressing apparatus 200-1' depicted in FIG. 7A. The same reference numerals as in FIGS. 3 to 5 denote the same components, and a description thereof will be made briefly or will be omitted.

The first dressing apparatus 200-1' depicted in FIGS. 7A and 7B may be a modification of the first dressing apparatus 200-1 depicted in FIG. 4.

This embodiment differs from the embodiment depicted in FIG. 4 in that a suction unit 180a is disposed around the cleaning liquid spray unit 170 so as to surround the cleaning liquid spray unit 170 and in that a blocking unit 188 is provided to prevent the particles 181, which are generated by the cleaning liquid sprayed from the cleaning liquid spray unit 170, from scattering. Except for these differences, the description of the first dressing apparatus 200-1 made above with reference to FIGS. 3 and 4 may be identically applied to the first dressing apparatus 200-1'.

Referring to FIGS. 7A and 7B, the first dressing apparatus 200-1' may include the brushing unit 160, the cleaning liquid spray unit 170, and the suction unit 180a.

The suction unit 180a may be disposed so as to surround the outer surface of the cleaning liquid spray unit 170, and may be in contact with the outer surface of the cleaning liquid spray unit 170. The suction unit 180a may include a suction port 182-1 for sucking particles and a discharge pipe (not shown) connected to the suction port 182-1 in order to discharge the particles 181 at a predetermined pressure or at a predetermined suction force.

In order to increase the rate of suction of the particles, the suction port 182-1 may surround the outer surface of the spray nozzle 172 of the cleaning liquid spray unit 170, and may be in contact with the outer surface of the spray nozzle 172.

The first dressing apparatus 200-1' may further include a blocking unit 188, which is disposed at the edge of the suction port 182-1.

The blocking unit 188 may protrude in the downward direction further than the lower end 10 of the suction port 182-1, and may prevent the cleaning liquid sprayed from the spray nozzle 172 from scattering to the surroundings.

In addition, the blocking unit 188 may protrude in the downward direction further than the lower end 20 of the spray nozzle 172. Although it is illustrated in FIG. 7A that the lower end 10 of the suction port 182-1 and the lower end 20 of the spray nozzle 172 are located in the same plane, the present invention is not limited thereto. In another embodiment, the lower end of the suction port 182-1 may be located below the lower end of the spray nozzle 172.

The first dressing apparatus 200-1' depicted in FIG. 7 is configured such that the suction port 182-1 is located so as to surround the spray nozzle 172 and such that the particles 181 can be easily sucked into the suction port 182-1 by the blocking unit 188. Therefore, when compared to the first dressing apparatus 200-1 depicted in FIGS. 3 and 4, it is possible to further increase the rate of suction of particles, and consequently to improve polishing uniformity and to suppress defects during the polishing process.

Figure 8:
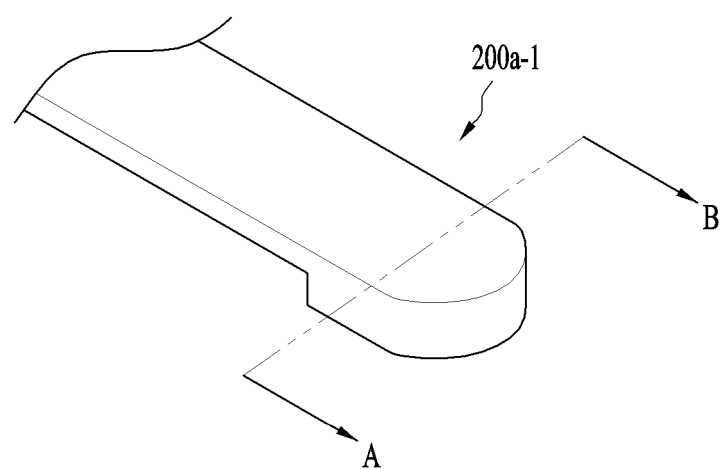
FIG. 8 illustrates a perspective view of a first dressing apparatus according to a further embodiment.
Figure 9:
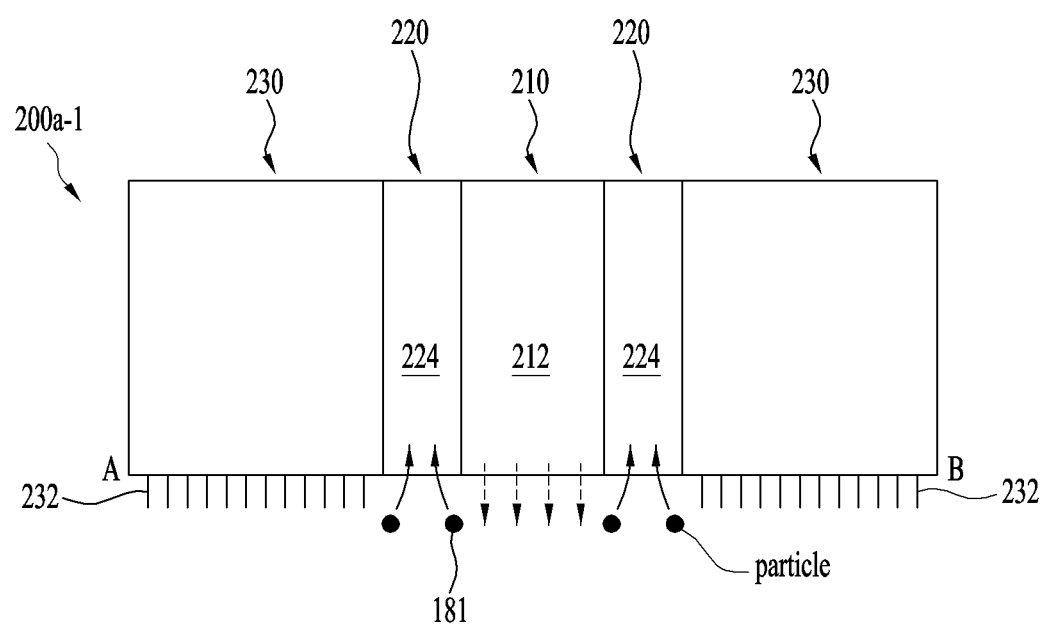
FIG. 9 illustrates a cross-sectional view of one embodiment of the first dressing apparatus depicted in FIG. 8 when viewed in the AB direction.
Figure 10:
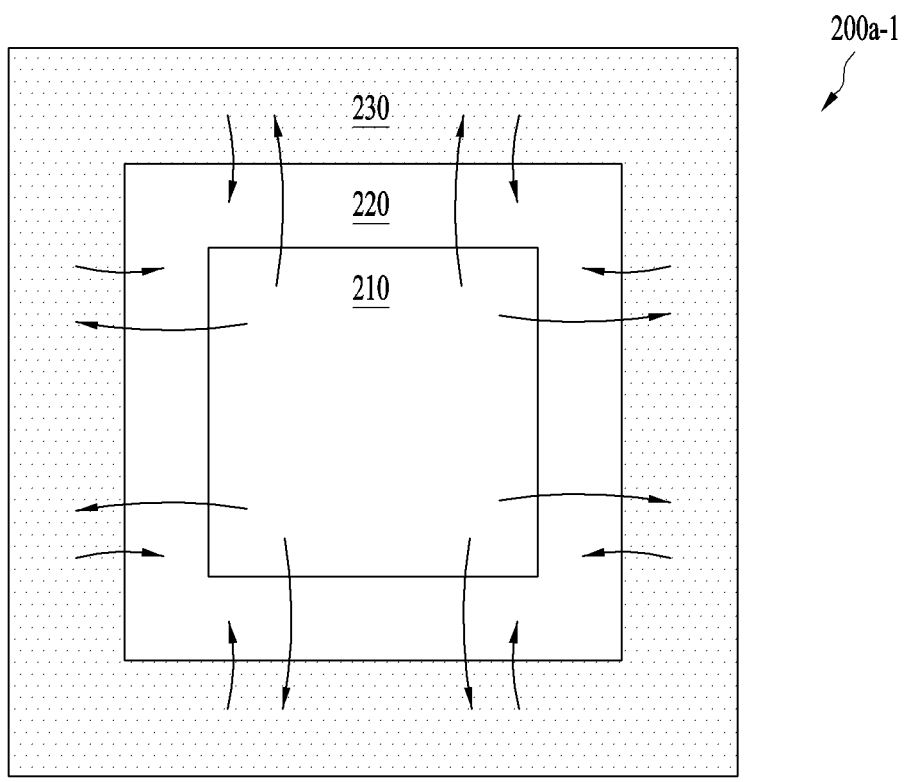
FIG. 10 illustrates a bottom view of the first dressing apparatus depicted in FIG. 9.

FIG. 8 illustrates a perspective view of a first dressing apparatus 200*a*-1 according to a further embodiment, FIG. 9 illustrates a cross-sectional view of one embodiment of the first dressing apparatus 200*a*-1 depicted in FIG. 8 when viewed in the AB direction, and FIG. 10 illustrates a bottom view of the first dressing apparatus 200*a*-1 depicted in FIG. 9.

Referring to FIGS. 8 to 10, the first dressing apparatus 200*a*-1 includes a cleaning liquid spray unit 210, a suction unit 220, and a brushing unit 230, which are in contact with each other in sequence. The cleaning liquid spray unit 210, the suction unit 220, and the brushing unit 230 may be fixed to each other, and may be rotated together at the same angular speed or at the same swing speed.

For example, the brushing unit 230, the suction unit 220 and the cleaning liquid spray unit 210 may be arranged so as to be in contact with each other in sequence in the inward direction from the outside of the first dressing apparatus 200*a*-1.

The cleaning liquid spray unit 210 may include a spray nozzle 212 having therein a hole, through which the cleaning liquid is sprayed, and a cleaning liquid supply pipe (not shown), through which the cleaning liquid is supplied to the spray nozzle 212 at a high pressure. The description of the cleaning liquid spray unit 170 made above with reference to FIGS. 3 to 5 may be applied to the cleaning liquid spray unit 210.

The suction unit 220 is disposed around the cleaning liquid spray unit 210 so as to surround the cleaning liquid spray unit 210. For example, the suction unit 220 may be in contact with the outer surface of the cleaning liquid spray unit 210, and may be disposed so as to surround the outer surface of the cleaning liquid spray unit 210.

The suction unit 220 may include a suction port 224 for sucking the particles 181 and a discharge pipe (not shown) connected to the suction port 224 in order to discharge the particles 181, which have been sucked through the suction port 224, at a predetermined pressure or at a predetermined suction force.

The suction port 224 may be in contact with the outer surface of the spray nozzle 212 of the cleaning liquid spray unit 210 so as to surround the outer surface of the spray nozzle 212.

The brushing unit 230 may be disposed around the suction unit 220 so as to surround the suction unit 220. For example, the brushing unit 230 may be in contact with the outer surface of the suction unit 220, and may be disposed so as to surround the outer surface of the suction unit 220.

For example, the brushing unit 230 may be in contact with the outer surface of the suction port 224, and may be disposed so as to surround the outer surface of the suction port 224.

The description of the functions and configurations of the brushing unit 160, the cleaning liquid spray unit 170 and the suction unit 180, which was made above with reference to FIGS. 3 and 4, may be applied to the first dressing apparatus 200*a*-1.

Since the brushing unit 230 is disposed so as to be in contact with the suction unit 220, it is possible to enhance the rate of suction of the particles 181, which are generated by the brushing, into the suction unit 220, and consequently to improve polishing uniformity and to suppress defects during the polishing process.

In addition, since the suction port 224 is disposed so as to be in contact with the spray nozzle 212, it is possible to easily suck the particles 181, which are generated by the cleaning liquid sprayed from the spray nozzle 212, into the suction port 224, and consequently to increase the rate of suction of the particles 181 into the suction unit 220.

In addition, since the suction port 224 is disposed so as to surround the spray nozzle 212, it is possible to prevent the particles 181, which are generated by the cleaning liquid sprayed from the spray nozzle 212, from scattering to the surroundings of the first dressing apparatus 200*a*-1. Through the improved rate of suction and prevention of scattering of particles, this embodiment is capable of improving polishing uniformity and of suppressing defects during the polishing process.

Figure 11:
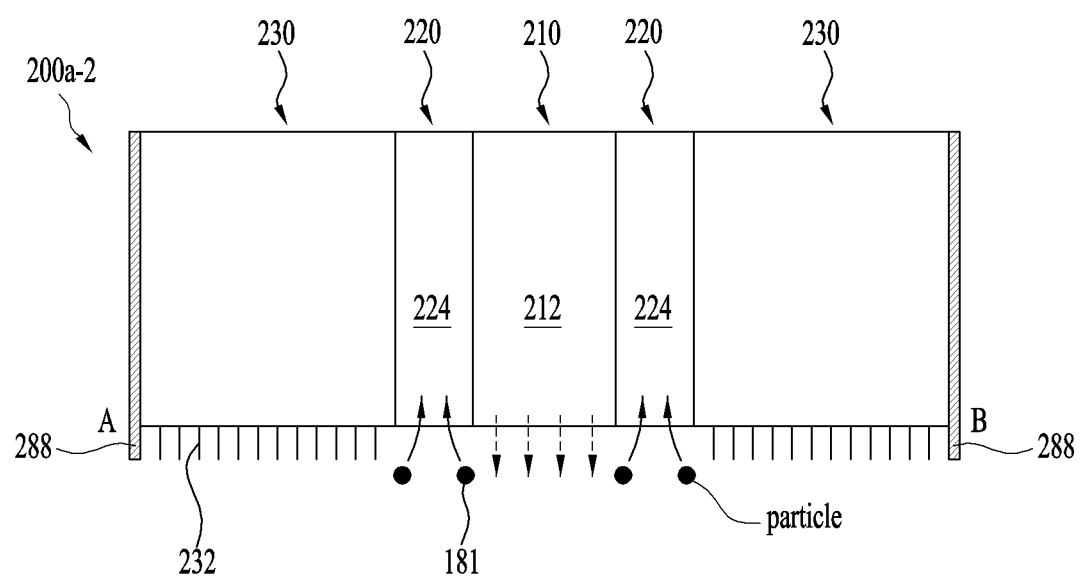
FIG. 11 illustrates a cross-sectional view of another embodiment of the first dressing apparatus depicted in FIG. 8 when viewed in the AB direction.
Figure 12:
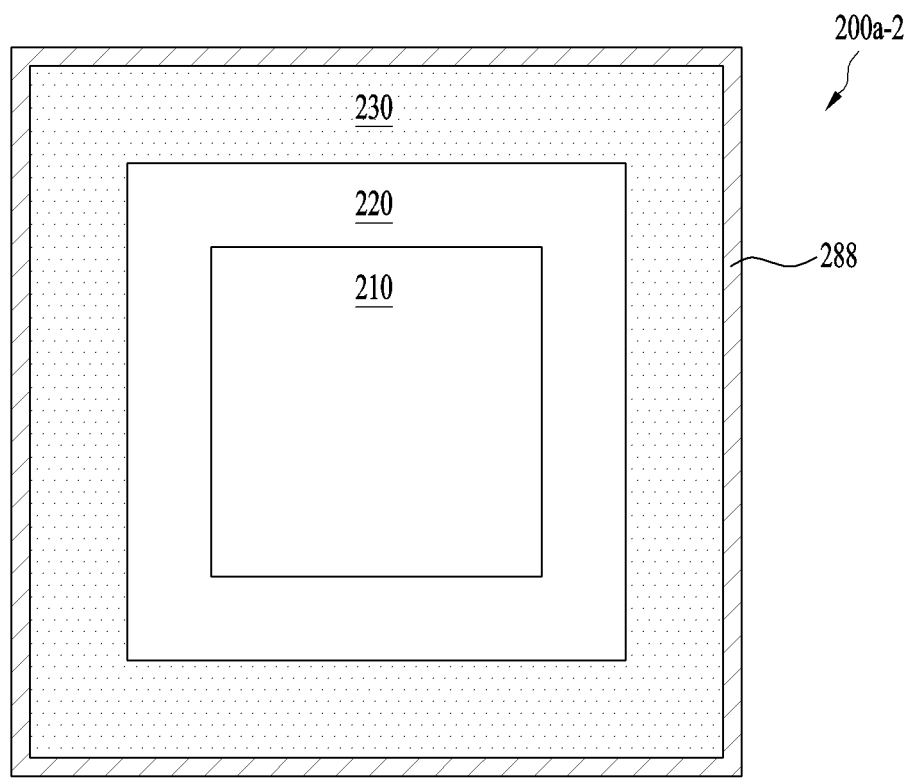
FIG. 12 illustrates a bottom view of the first dressing apparatus depicted in FIG. 11.

FIG. 11 illustrates a cross-sectional view of another embodiment 200*a*-2 of the first dressing apparatus depicted in FIG. 8 when viewed in the AB direction, and FIG. 12 illustrates a bottom view of the first dressing apparatus 200*a*-2 depicted in FIG. 11. The same reference numerals as in FIGS. 9 and 10 denote the same components, and a description thereof will be made briefly or will be omitted.

Referring to FIGS. 11 and 12, the first dressing apparatus 200*a*-2 may further include a blocking unit 288, in addition to the configuration of the dressing apparatus 200*a*-1 depicted in FIGS. 9 and 10.

The blocking unit 288 protrudes in the downward direction further than the bottom surface of the brushing unit 230, at which brushes 232 are provided. For example, the blocking unit 288 may be disposed so as to be in contact with the outer surface of the brushing unit 230, and may protrude in the downward direction further than the bottom surface of the brushing unit 230.

Alternatively, the blocking unit 288 may protrude in the downward direction further than the bottom surface of the suction unit 220 or the bottom surface of the cleaning liquid spray unit 210.

For example, the blocking unit 288 may be disposed so as to be in contact with the edge of the bottom surface of the brushing unit 230.

The blocking unit 288 prevents the cleaning liquid sprayed from the spray nozzle 212 from scattering to the surroundings, thereby suppressing the generation of particles, and prevents the particles 181, which are generated by the brushing of the brushing unit 230, from scattering to the surroundings, thereby easily sucking the particles into the suction port 224 and consequently increasing the rate of suction of the particles 181.

Figure 13:
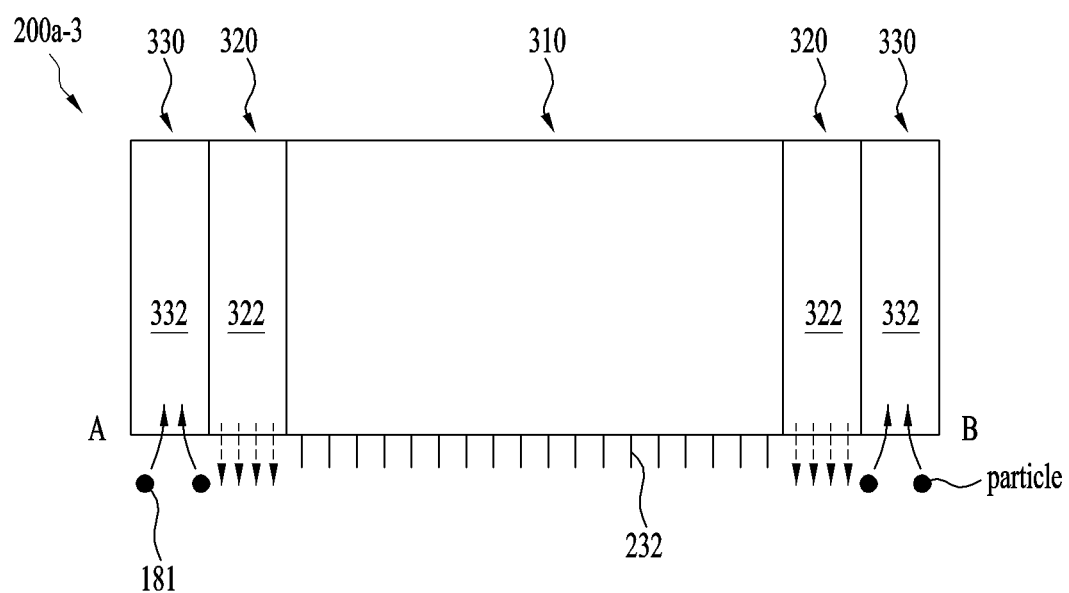
FIG. 13 illustrates a cross-sectional view of a further embodiment of the first dressing apparatus depicted in FIG. 8 when viewed in the AB direction.
Figure 14:
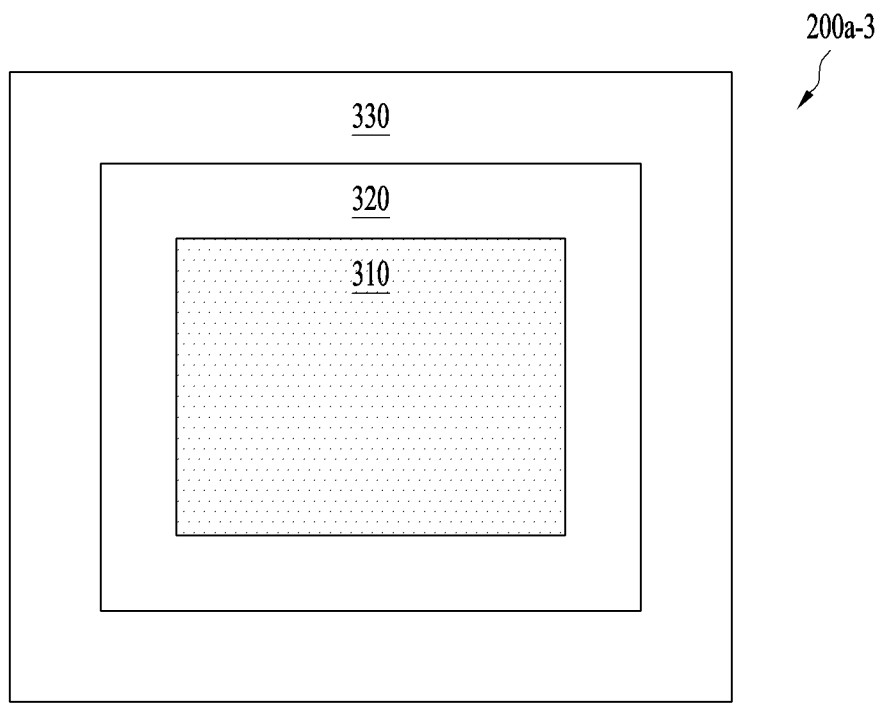
FIG. 14 illustrates a bottom view of the dressing apparatus depicted in FIG. 13.

FIG. 13 illustrates a cross-sectional view of a further embodiment 200*a*-3 of the first dressing apparatus depicted in FIG. 8 when viewed in the AB direction, and FIG. 14 illustrates a bottom view of the dressing apparatus 200a-3 depicted in FIG. 13.

Referring to FIGS. 13 and 14, the first dressing apparatus 200a-3 includes a brushing unit 310, a cleaning liquid spray unit 320, and a suction unit 330, which are in contact with each other in sequence.

The brushing unit 310, the cleaning liquid spray unit 320 and the suction unit 330 may be fixed to each other, and may be rotated at the same angular speed or at the same swing speed.

In FIG. 10, the brushing unit 230, the suction unit 220 and the cleaning liquid spray unit 210 are arranged in sequence in the inward direction from the outside. However, as shown in FIG. 14, the suction unit 330, the cleaning liquid spray unit 320 and the brushing unit 310 are arranged in sequence in the inward direction from the outside.

The brushing unit 310 may include a brush 312 and a brush-moving portion (not shown).

The cleaning liquid spray unit 320 is disposed around the brushing unit 310 so as to surround the brushing unit 310. For example, the cleaning liquid spray unit 320 may be in contact with the outer surface of the brushing unit 310, and may be disposed so as to surround the outer surface of the brushing unit 310.

The cleaning liquid spray unit 320 may include a spray nozzle 322 and a cleaning liquid supply pipe (not shown) for supplying cleaning liquid to the spray nozzle 322.

For example, the spray nozzle 322 may be in contact with the outer surface of the brushing unit 310, and may be disposed so as to surround the outer surface of the brushing unit 310.

The suction unit 330 is disposed around the cleaning liquid spray unit 320 so as to surround the cleaning liquid spray unit 320.

For example, the suction unit 330 may be in contact with the outer surface of the cleaning liquid spray unit 320, and may be disposed so as to surround the outer surface of the cleaning liquid spray unit 320.

The suction unit 330 may include a suction port 332 and a discharge pipe (not shown) connected to the suction port 332. The suction port 332 may be in contact with the outer surface of the spray nozzle 322 of the cleaning liquid spray unit 320, and may be disposed so as to surround the outer surface of the spray nozzle 322.

Since the brushing unit 310 is located at the center portion and the suction unit 330 is disposed so as to surround the brushing unit 310, it is possible to enhance the rate of suction of the particles 181, which are generated by the brushing, into the suction unit 330, and consequently to improve polishing uniformity and to suppress defects during the polishing process.

In addition, since the suction port 332 is in contact with the spray nozzle 322, it is possible to easily suck the particles 181, which are generated by the cleaning liquid sprayed from the spray nozzle 332, into the suction port 332, and consequently to increase the rate of suction of the particles 181 into the suction unit 332.

In addition, since the suction port 332 is disposed so as to surround the spray nozzle 322, it is possible to prevent the particles 181, which are generated by the cleaning liquid sprayed from the spray nozzle 322, from scattering to the surroundings of the first dressing apparatus 200a-3. Through the improved rate of suction and prevention of scattering of particles, this embodiment is capable of improving polishing uniformity and of suppressing defects during the polishing process.

Figure 15:
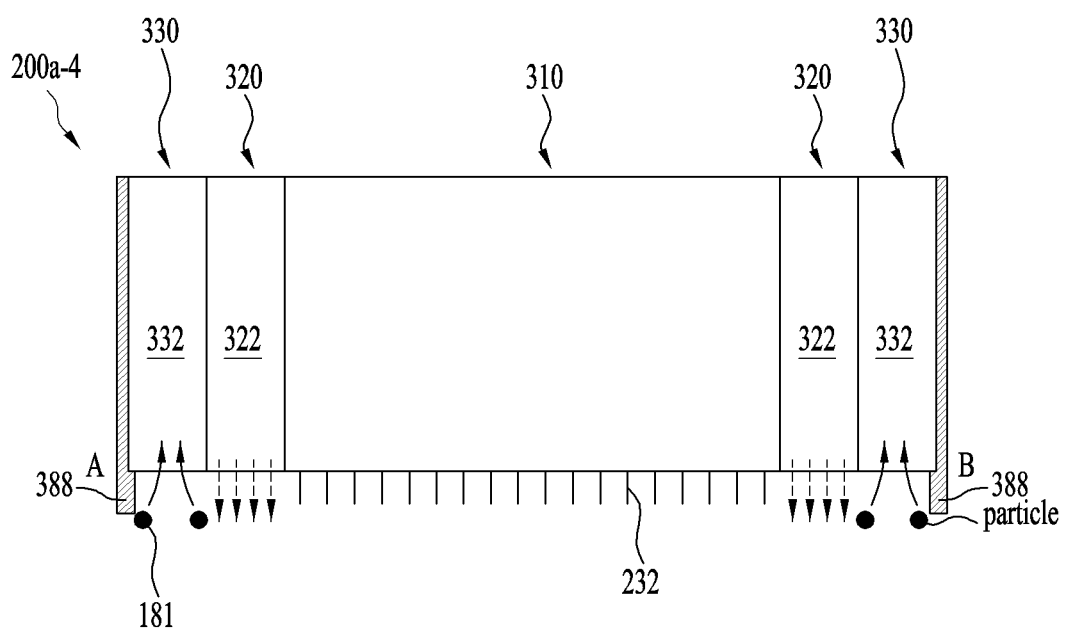
FIG. 15 illustrates a cross-sectional view of a further embodiment of the first dressing apparatus depicted in FIG. 8 when viewed in the AB direction.
Figure 16:
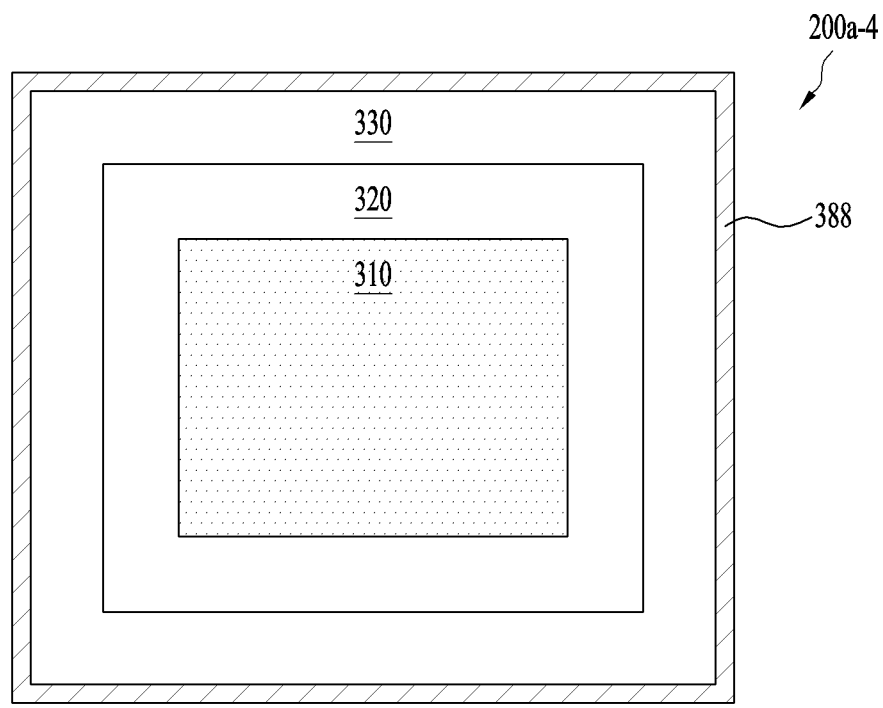
FIG. 16 illustrates a bottom view of the first dressing apparatus depicted in FIG. 15.

FIG. 15 illustrates a cross-sectional view of a further embodiment 200a-4 of the first dressing apparatus depicted in FIG. 8 when viewed in the AB direction, and FIG. 16 illustrates a bottom view of the first dressing apparatus 200a-4 depicted in FIG. 15. The same reference numerals as in FIGS. 13 and 14 denote the same components, and a description thereof will be made briefly or will be omitted.

Referring to FIGS. 15 and 16, the first dressing apparatus 200a-4 may further include a blocking unit 388, in addition to the configuration of the dressing apparatus 200a-3 depicted in FIGS. 13 and 14.

The blocking unit 388 is in contact with the outer surface of the suction port 332, and protrudes in the downward direction further than the bottom surface of the suction port 332. For example, the blocking unit 388 may be disposed so as to be in contact with the outer surface of the suction port 332, and may protrude in the downward direction further than the bottom surface of the suction port 332. For example, the blocking unit 388 may be disposed so as to be in contact with the edge of the bottom surface of the suction port 332.

Alternatively, the blocking unit 388 may protrude in the downward direction further than the bottom surface of the cleaning liquid spray unit 320 or the bottom surface of the brushing unit 310.

The blocking unit 388 prevents the cleaning liquid sprayed from the spray nozzle 322 from scattering to the surroundings, thereby suppressing the generation of particles, and prevents the particles 181, which are generated by the brushing of the brushing unit 310, from scattering to the surroundings, thereby easily sucking the particles into the suction port 332 and consequently increasing the rate of suction of the particles 181.

Figure 17:
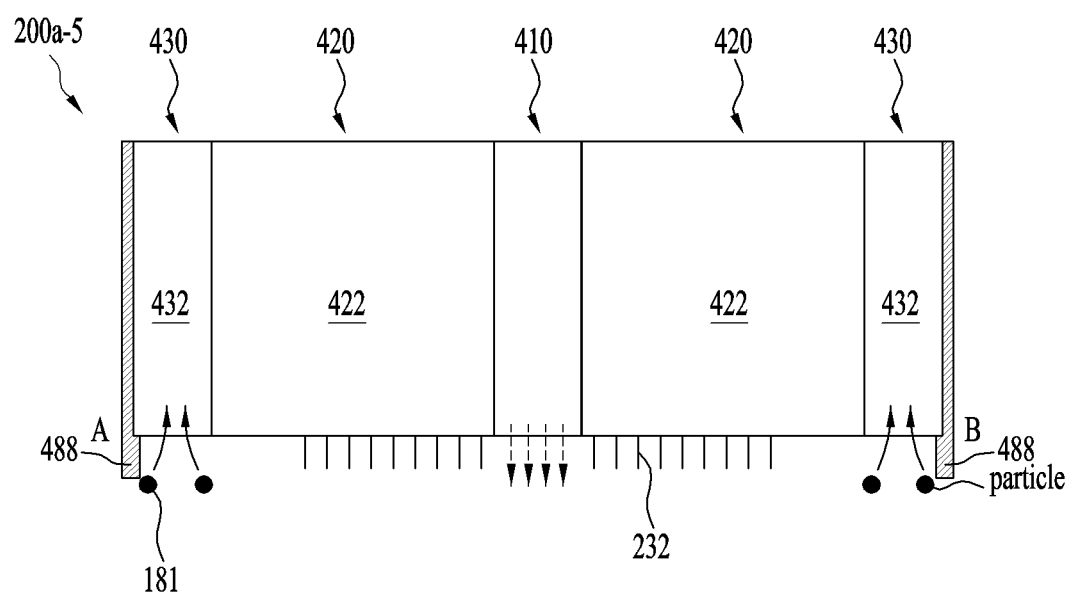
FIG. 17 illustrates a cross-sectional view of a further embodiment of the first dressing apparatus depicted in FIG. 8 when viewed in the AB direction.
Figure 18:
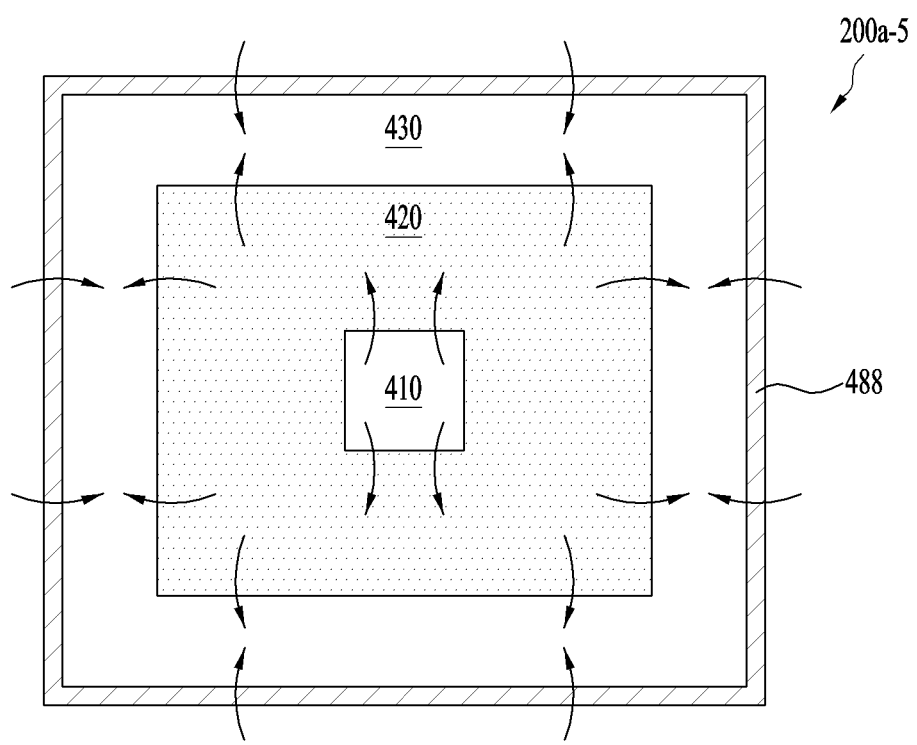
FIG. 18 illustrates a bottom view of the first dressing apparatus depicted in FIG. 17.

FIG. 17 illustrates a cross-sectional view of a further embodiment 200a-5 of the first dressing apparatus depicted in FIG. 8 when viewed in the AB direction, and FIG. 18 illustrates a bottom view of the first dressing apparatus 200a-5 depicted in FIG. 17.

Referring to FIGS. 17 and 18, the first dressing apparatus 200-5 includes a cleaning liquid spray unit 410, a brushing unit 420, and a suction unit 430, which are in contact with each other in sequence. In addition, the first dressing apparatus 200-5 may further include a blocking unit 488.

The cleaning liquid spray unit 410, the brushing unit 420 and the suction unit 430 may be in contact with and fixed to each other, and may be rotated together at the same angular speed or at the same swing speed.

As shown in FIG. 17, the suction unit 430, the brushing unit 420 and the cleaning liquid spray unit 410 may be arranged in sequence in the inward direction from the outside.

The cleaning liquid spray unit 410 may include a spray nozzle and a cleaning liquid supply pipe (not shown) for supplying cleaning liquid to the spray nozzle.

The brushing unit 420 may include a brush 422 and a brush-moving portion (not shown).

The brushing unit 420 may be disposed around the cleaning liquid spray unit 410 so as to surround the cleaning liquid spray unit 410. For example, the brushing unit 420 may be in contact with the outer surface of the cleaning liquid spray unit 410, and may be disposed so as to surround the outer surface of the cleaning liquid spray unit 410. For example, the brush 422 may be in contact with the outer surface of the spray nozzle, and may be disposed so as to surround the outer surface of the spray nozzle.

The suction unit 430 is disposed around the brushing unit 420 so as to surround the brushing unit 420.

For example, the suction unit 430 may be in contact with the outer surface of the brushing unit 420, and may be disposed so as to surround the outer surface of the brushing unit 420.

The suction unit 430 may include a suction port 432 and a discharge pipe (not shown) connected to the suction port 432. The suction port 432 may be in contact with the outer surface of the brush 422 of the brushing unit 420, and may be disposed so as to surround the outer surface of the brush 422.

Since the suction unit 430 is disposed so as to surround the brushing unit 420 and the cleaning liquid spray unit 410, it is possible to enhance the rate of suction of the particles 181, which are generated by the brushing, into the suction unit 330, and consequently to improve polishing uniformity and to suppress defects during the polishing process.

The blocking unit 488 is in contact with the outer surface of the suction port 432, and protrudes in the downward direction further than the bottom surface of the suction port 432. The description of the blocking unit 388 made above with reference to FIG. 15 may be identically applied to the blocking unit 488 depicted in FIG. 17.

Figures 19, 20:
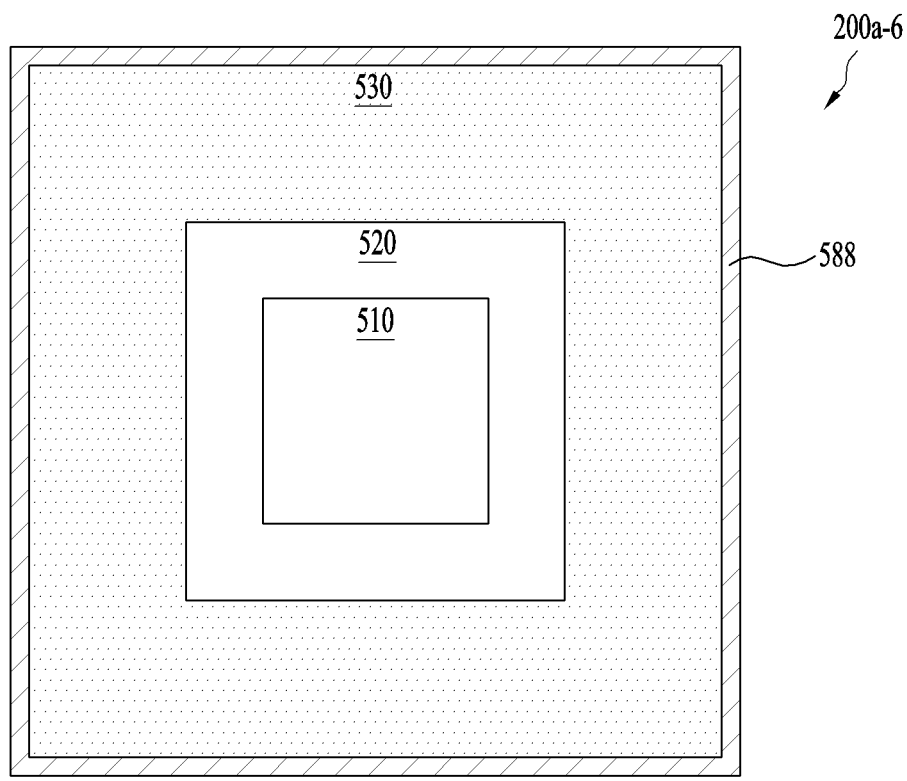
FIG. 19 illustrates a bottom view of a further embodiment of the first dressing apparatus depicted in FIG. 8.
FIG. 20 shows the number of particles that are generated during a dressing process.

FIG. 19 illustrates a bottom view of a further embodiment 200a-6 of the first dressing apparatus depicted in FIG. 8.

Referring to FIG. 19, the first dressing apparatus 200a-6 includes a suction unit 510, a cleaning liquid spray unit 520, and a brushing unit 530, which are in contact with each other in sequence.

The suction unit 510, the cleaning liquid spray unit 520 and the brushing unit 530 may be fixed to each other, and may be rotated together at the same angular speed or at the same swing speed.

The brushing unit 530, the cleaning liquid spray unit 520 and the suction unit 510 may be arranged in sequence in the inward direction from the outside.

The spray nozzle of the cleaning liquid spray unit 520 may be in contact with the outer surface of the suction port of the suction unit 510, and may be disposed so as to surround the outer surface of the suction port.

The brushing unit 530 may be in contact with the outer surface of the spray nozzle of the cleaning liquid spray unit 520, and may be disposed so as to surround the outer surface of the spray nozzle of the cleaning liquid spray unit 520.

The blocking unit 588 protrudes in the downward direction further than the bottom surface of the brushing unit 530. For example, the blocking unit 588 may be disposed so as to be in contact with the outer surface of the brushing unit 530, and may protrude in the downward direction further than the bottom surface of the suction port of the suction unit 510 or the bottom surface of the spray nozzle of the cleaning liquid spray unit 520.

A description of the polishing process of the polishing apparatus 100 depicted in FIG. 1 using the dressing apparatuses according to the above-described embodiments will be made as follows.

First, a wafer present on the loading portion 102a is loaded onto the transfer unit 104 by the feeding robot 103-2.

Subsequently, the wafer loaded on the transfer unit 104 is loaded onto the first polishing table 106-1 by the head unit 120, and a first polishing process is performed with respect to the wafer, which is loaded on the first polishing table 106-1 by the head chucks 124-1 and 124-2 of the head unit 120.

For example, the first polishing process may be performed in a manner such that slurry is supplied from the slurry supply unit 140 to the polishing pad 220 of the first polishing table 106-1, which is rotating, and at the same time, the wafer loaded on the polishing pad 220 is pressurized and rotated by the head chucks 124-1 and 124-2.

When the first polishing process is completed, the supply of slurry from the slurry supply unit 140 is stopped. The wafer is separated from the first polishing table 106-1 by the rising of the head chucks 124-1 and 124-2, is unloaded from the polishing pad 220 of the first polishing table 106-1 by the rotation of the upper plate 122 of the head unit 120, and is transferred to the second polishing table 106-2.

When the first polishing process is completed, a first dressing process is performed with respect to the polishing pad 220 of the first polishing table 106-1 by the first dressing apparatus 200-1.

The first dressing process may be performed simultaneously with the unloading of the wafer from the polishing pad 220 of the first polishing table 106-1 by the head unit 120 and the transfer thereof to the second polishing table 106-2.

The first dressing apparatus 200-1 may swing to the polishing pad 220 of the first polishing table 106-1 about one end 160b of the first dressing apparatus 200-1 at the predetermined angular speed or at the predetermined swing speed.

Since the first dressing apparatus 200-1 is configured such that the brushing unit 160, the cleaning liquid spray unit 170 and the suction unit 180 are fixed to each other, the brush 162 of the brushing unit 160, the spray nozzle 172 of the cleaning liquid spray unit 170 and the suction port 182 of the suction unit 180 are rotated so as to run together on the surface of the polishing pad 220 of the first polishing table 106-1 at the same angular speed or at the same swing speed, thereby performing the dressing process with respect to the polishing pad 220 of the first polishing table 106-1.

Subsequently, a second polishing process is performed with respect to the wafer, which has been carried to the second polishing table 106-2 by the head unit 120. The second polishing process may be performed in the same way as the first polishing process.

When the second polishing process is completed, the wafer is unloaded from the polishing pad 220 of the second polishing table 106-2 by the head unit 120 and is transferred to the third polishing table 106-3.

After the second polishing process is completed, a second dressing process is performed with respect to the polishing pad 220 of the second polishing table 106-2 by the second dressing apparatus 200-2. The second dressing process may be performed in the same way as the first dressing process.

A third polishing process at the third polishing table 106-3 and a third dressing process for the polishing pad 220 of the third polishing table 106-3 may also be performed in the same way as described above.

When the third polishing process is completed, the wafer is unloaded from the polishing pad 220 of the third polishing table 106-3 by the head unit 120 and is loaded onto the wafer supports 104-5 and 104-5 of the transfer unit 104.

Subsequently, the wafer loaded on the transfer unit 104 is fed to the unloading portion 102b by the feeding robot 103-1 and is stored in the wafer storage units 102-1 and 102-2.

In general, while the first dressing process is performed, a large number of particles may be generated by fine-mist-type cleaning liquid that is sprayed in the air at a high pressure.

FIG. 20 shows the number of particles that are generated during the dressing process. 0.1 µm, 0.2 µm, 0.3 µm, 0.5 µm, 1.0 µm, and 5.0 µm are diameters of the generated particles.

Referring to FIG. 20, the number of particles having relatively small diameters is greater than the number of particles having relatively large diameters. Further, the number of particles that are generated during the dressing process is greater than the number of particles that are generated in a non-polishing state or during the polishing process.

When the polishing process at the first polishing table is completed, the wafer, which has undergone the first polishing process, is transferred to the second polishing table by the head unit 120, and the dressing process is performed with respect to the polishing pad of the first polishing table. However, while the dressing process is performed with respect to the polishing pad of the first polishing table, the polished surface of the wafer is separated from the polishing pad by the head unit 120. Therefore, a large number of particles that are generated during the dressing process may be adsorbed onto the exposed surface of the wafer, and these particles may cause unevenness on the surface of the wafer and defects (for example, juts) of the wafer while the second polishing process is performed at the second polishing table.

Since the brush 162 of the brushing unit 160, the spray nozzle 172 of the cleaning liquid spray unit 170 and the suction port 182 of the suction unit 180 run together on the surface of the polishing pad 220 of the first polishing table 106-1 at the same angular speed or at the same swing speed, the particles 181, which are generated by the cleaning liquid sprayed from the spray nozzle 172, may be easily sucked into the suction port 182 of the suction unit 180, which is disposed adjacent to the spray nozzle, and consequently the rate of suction of the particles 181 into the suction unit 180 may be increased. Through the improved rate of suction of particles, the embodiments are capable of improving polishing uniformity and of suppressing defects during the polishing process.

The features, structures and effects described in association with the embodiments above are incorporated into at least one embodiment of the present invention, but are not limited only to the one embodiment. Furthermore, the features, structures and effects exemplified in association with respective embodiments can be implemented in other embodiments by combination or modification by those skilled in the art. Therefore, contents related to such combinations and modifications should be construed as falling within the scope of the present invention.

INDUSTRIAL APPLICABILITY

Embodiments may be used for a wafer polishing process in a wafer manufacturing process.

The invention claimed is:
1. A dressing apparatus for dressing a polishing pad, the dressing apparatus comprising:
 a brushing unit having a brush;
 a cleaning liquid spray unit having a spray nozzle for spraying cleaning liquid to the polishing pad; and
 a suction unit having a suction port for sucking particles that are generated when the cleaning liquid spray unit sprays cleaning liquid,
 wherein the brushing unit, the cleaning liquid spray unit and the suction unit are coupled to each other and swing together on the polishing pad, and
 wherein the suction port is provided so as to surround an outer surface of the spray nozzle.
2. The dressing apparatus according to claim 1, wherein the brushing unit, the cleaning liquid spray unit and the suction unit swing on the polishing pad at a same swing speed.
3. The dressing apparatus according to claim 2, wherein a first distance by which the suction port is spaced apart from the spray nozzle is less than a second distance by which the spray nozzle is spaced apart from the brushing unit.
4. The dressing apparatus according to claim 1, wherein the spray nozzle is disposed to be spaced apart from the brushing unit in a horizontal direction, the suction port is disposed to be spaced apart from the spray nozzle in the horizontal direction, and the horizontal direction is parallel to a top surface of the polishing pad.
5. The dressing apparatus according to claim 4, further comprising:
 a first fixing portion for fixing the cleaning liquid spray unit to the brushing unit; and
 a second fixing portion for fixing the suction unit to the cleaning liquid spray unit.
6. The dressing apparatus according to claim 1, wherein each of the cleaning liquid spray unit and the suction port is spaced apart from the brushing unit.
7. The dressing apparatus according to claim 1, further comprising:
 a blocking unit protruding in a downward direction to extend further downward than a lower end of the suction port and so as to surround the suction port.
8. The dressing apparatus according to claim 1, wherein the cleaning liquid spray unit, the suction unit and the brushing unit are in contact with each other in sequence.
9. The dressing apparatus according to claim 8, wherein the brushing unit, the suction unit and the cleaning liquid spray unit are arranged sequentially.
10. The dressing apparatus according to claim 9, wherein the brushing unit surrounds the suction port of the suction unit.
11. The dressing apparatus according to claim 10, further comprising:
 a blocking unit disposed so as to be in contact with an outer surface of the brushing unit and protruding in a downward direction to extend further downward than a bottom surface of the brushing unit.
12. The dressing apparatus according to claim 8, wherein the suction unit, the cleaning liquid spray unit and the brushing unit are arranged sequentially.
13. The dressing apparatus according to claim 12, wherein the spray nozzle of the cleaning liquid spray unit surrounds an outer surface of the brushing unit.
14. The dressing apparatus according to claim 13, further comprising:
 a blocking unit disposed so as to be in contact with an outer surface of the suction port of the suction unit and protruding in a downward direction to extend further downward than a bottom surface of the suction port of the suction unit.
15. The dressing apparatus according to claim 1, wherein the suction unit further includes a discharge pipe for discharging particles that are sucked through the suction port, the discharge pipe discharging particles at a predetermined pressure or at a predetermined flow rate, and
 wherein the suction port has a diameter larger than a diameter of the discharge pipe.
16. The dressing apparatus according to claim 1, wherein the brushing unit further includes:
 a brush-moving portion for swinging the brush on a surface of the polishing pad, and
 wherein the brush-moving portion is configured to swing the brush, the cleaning liquid spray unit and the suction unit on the polishing pad at a same swing speed.
17. A wafer polishing apparatus comprising:
 a polishing table comprising a lower plate and a polishing pad attached to the lower plate;

a head unit for loading a wafer onto the polishing pad and polishing the loaded wafer by pressurizing the wafer; and a dressing apparatus described in claim 1, the dressing apparatus being configured to dress the polishing pad.

18. A dressing apparatus according for dressing a polishing pad, the dressing apparatus comprising:

a brush;

a spray nozzle to spray cleaning liquid to the polishing pad; and a suction port to suck particles that are generated when the spray nozzle sprays cleaning liquid, wherein the brush, the spray nozzle, and the suction port are coupled to each other, wherein the brush, the spray nozzle, and the suction port are arranged sequentially, and wherein the spray nozzle surrounds an outer surface of the suction port, and the brush surrounds an outer surface of the spray nozzle.

* * * * *